United States Patent [19]

Calabro et al.

[11] 3,846,788

[45] Nov. 5, 1974

[54] POLYDECADE DECIMAL TO DIGITAL ENCODER

[75] Inventors: Salvatore R. Calabro, Belleville, N.J.; John A. Calabro, Forest Hills, N.Y.; Peter R. Mick, East Orange, N.J.

[73] Assignee: Automated Technology Corporation, Hackensack, N.J.

[22] Filed: Dec. 12, 1972

[21] Appl. No.: 314,391

Related U.S. Application Data

[63] Continuation-in-part of Ser. No. 128,237, March 26, 1971, abandoned.

[52] U.S. Cl. ............ 340/347 P
[51] Int. Cl. ............ G08c 9/06
[58] Field of Search ............ 340/347 P; 250/231 SE; 346/14 MR

[56] References Cited

UNITED STATES PATENTS

| | | | |
|---|---|---|---|
| 3,135,954 | 6/1964 | Francisco | 340/347 P |
| 3,170,155 | 2/1965 | Smith, Jr. et al. | 340/347 P |
| 3,252,157 | 5/1966 | Pabst | 340/347 P |
| 3,262,108 | 7/1966 | Schuman | 340/347 P |
| 3,268,885 | 8/1966 | Coyle et al. | 340/347 P |
| 3,310,801 | 3/1967 | Hood, Jr. et al. | 340/347 P |
| 3,484,780 | 12/1969 | Kamoi et al. | 340/347 P |
| 3,487,460 | 12/1969 | Wheeler | 340/347 P |
| 3,518,663 | 6/1970 | Oddo et al. | 340/347 P |

*Primary Examiner*—Charles D. Miller
*Attorney, Agent, or Firm*—Sommers & Sommers

[57] ABSTRACT

A polydecade decimal-to-digital encoder for providing unambiguous digitally encoded signals corresponding to the analog decimal reading present on a utility meter or the like. An electroluminescent source and appropriate masks are utilized to provide a plurality of point light sources, which are in light registration with an array of photodiodes. A plurality of encoding wheels, one associated with each of the rotatable shafts carrying the dial indicators for the meter, are positioned to enable occlusion of incident light on the photosensors in accordance with the angular position of the various encoding wheels. Transmission through the wheels is enabled by slotted segments arranged in two concentric tracks. Associated logic circuitry acts to effect a reading decision where a borderline value is present at the least significant digit (LSD) being read on the meter. Upon this least significant digit reading being determined, the said logic directs selection of the sensors utilized for reading successively higher decades in accordance with the decision rendered at the LSD reading.

8 Claims, 7 Drawing Figures

INVENTOR

BY

INVENTOR

BY

POLYDECADE DECIMAL TO DIGITAL ENCODER

This application is a continuation-in-part of our copending application, now abandoned Ser. No. 128,237, filed Mar. 26, 1971 for "Polydecade Decimal to Digital Encoder".

BACKGROUND OF INVENTION

This invention relates generally to encoding devices, and more specifically relates to apparatus for converting the analog value of a rotatable shaft to corresponding digital information for transmission to a utilization point.

Electric, gas, water, or similar meters, are typically characterized by a plurality of rotatable shafts which are so interrelated that successive shafts are angularly displaced on a ten-to-one basis with respect to its neighbor, whereby a direct decimal read-out of the meter is enabled, by means of indicator hands which rotate with the several shafts about dials on a face plate. In a typical power utility installation, for example, periodic reading of the meter is conducted by an individual who inspects the readings at each of the plurality of dials associated with the several shafts, and thereby may record a direct decimal value.

Within recent years a considerable amount of interest has been evidenced in the concept of automating the read-out function of the "polydecade" meters, as described above. Among the reasons that may be cited for such interest is a desire to reduce the cost of manual servicing, and the fact that the meters sought to be read are often in relatively inaccessible places in homes, and at factories and other industrial installations. Moreover, interest has largely centered in providing an automated read-out in such a form that the said read-out may be directly transmitted as, for example, by conventional transmission lines, to the utility company or other provider of the services recorded on the meter. Such result would not only vastly increase the efficiency and speed with which the meter read-out may be available to such suppliers, but moreover provides, as desired, a virtually continuous capability for obtaining such information.

In order to achieve the sought-after results indicated, numerous constructions have been proposed, basically intended to provide digitally encoded signals from the said meters in accordance with the decimal reading present thereat. A principal problem, however, with the bulk of proposed prior art systems, has been that errors in the automated read-outs can occur in several ways, each of which may introduce intolerable results into the digitally transmitted information. In this connection it may firstly be noted that one source of such error lies in the binary code itself, where a change from one decimal number to a successive number may be represented by change at several of the corresponding binary digits. This introduces the possibility of multiple points at which error can be made in the conversion process. In order to eliminate this possibility, it has become common to utilize in analog-to-digital conversion equipment the so-called "Gray code" or reflected binary system. The advantage of the cited Gray code system is that successive integers differ from one another by only one digit. Under some circumstances, however, as will become further apparent hereinbelow, a simple reflected binary system yet permits ambiguities in that when the binary " 0" is represented by the absence of a signal, it is not desirable to have the decimal symbol "0" represented by binary "0000" since it cannot be distinguished from a no-signal condition.

In the type of meters to which the present invention pertains, a further and highly significant source of error may occur as a given decade approaches a whole number. For example, in a typical watt-hour meter we may consider the ambiguity that may arise upon the dial pointer hand for the "thousands" reading approaching a whole number. As this happens it will be evident that the adjacent "hundreds" dial pointer approaches simultaneously "0". Suppose the thousand pointer thus reaches the whole number "6" as the hundreds pointer is between the digits "9 and 0". It will be evident that a manual observer reading the said dial plate would properly read the number as "5900". On the other hand, a straight digital read-out from the adjacent dials could erroneously indicate a reading of "6900"—a relatively enormous error. Basically, it will be evident that the manual decision process involved in obtaining a correct (as above) reading involves inspecting the lower decade in an ambiguous situation and making a decision from the reading at the lower decade as to what value should properly be assigned to the adjacent higher decade. In other words, in the example cited, the observer having decided that the hundreds pointer is between 900 and the 1000, then assigns a value of 5,000 to the adjacent 1000 - decade pointer.

The possible sources of errors as just described, can accordingly introduce intolerable results into a digitally encoded read-out. In the past in order to eliminate the several possibilities cited, relatively complex and bulky electronic or optical means have been proposed for use in conversion devices of the present type. Not only, however, have such proposed construction tended to introduce inordinate and unacceptable costs into the said equipment, but moreover the consequent bulk of the proposed constructions has been such as to not be readily applicable to the compact meters that are commonly employed in utility and similar measuring applications. For example, the manually read dials associated with a typical power utility meter, may be of the order of ½ inch in diameter. In this type of compact environment the use (e.g. as sometimes proposed) of numerous auxiliary tracks to remove ambiguities of the type mentioned in the foregoing paragraphs, becomes highly impractical.

In accordance with the foregoing it may be regarded as an object of the present invention, to provide apparatus enabling accurate and unambiguous conversion of the decimally presented reading indications present on oil, electric, gas, water meters, or the like, into digitally encoded information for subsequent transmission over data lines capable of carrying such information.

It is a further object of the present invention, to provide apparatus enabling digitally encoded signals to be read out from polydecade meters, which assures nonambiguous read-out from the said meters, and which achieves definitude in the read-out with use of simple and highly effective electronic and optical means, which means are furthermore extremely compact and do not add materially to the bulk of the associated meter.

SUMMARY OF INVENTION

Now in accordance with the present invention, the foregoing objects and others as become apparent in the course of the ensuing specification, are achieved in a system which utilizes a plurality of point light sources and paired point photo-sensors, together with a plurality of encoder wheels, one of which is associated with each successive decade shaft of the meter. Concentric light transmitting tracks are present on each of the said encoding wheels, which tracks cooperate with the light source-sensor pairs, to provide outputs at said sensors in accordance with the angular position of the shaft and encoder wheels.

Each of the encoder wheels carries but two such concentric tracks, thus enabling a very compact construction, and one wherein minimum bleeding of light from track-to-track and thus from sensor-to-sensor is possible. Four sensor read-out points are associated with the shaft for the least significant digit, and seven read-out points are similarly provided for each of the higher decimal power shafts. Decoding logic circuitry is provided in the system which acts to effect a decision in a borderline reading situation at the least significant digit, and then latches on such reading. The logic having thus determined which way the least significant digit is to be read, thereupon directs selection of photo-sensor readouts at the successively higher decades in accordance with the decision rendered at the lowest decade, as to avoid use of photo-sensors which are at borderline zones of illumination, thereby avoiding possible ambiguities in the readings of these higher decades.

BRIEF DESCRIPTION OF DRAWINGS

The invention is diagrammatically illustrated by way of example in the drawings appended hereto in which.

DESCRIPTION OF PREFERRED EMBODIMENT

Figure 1:
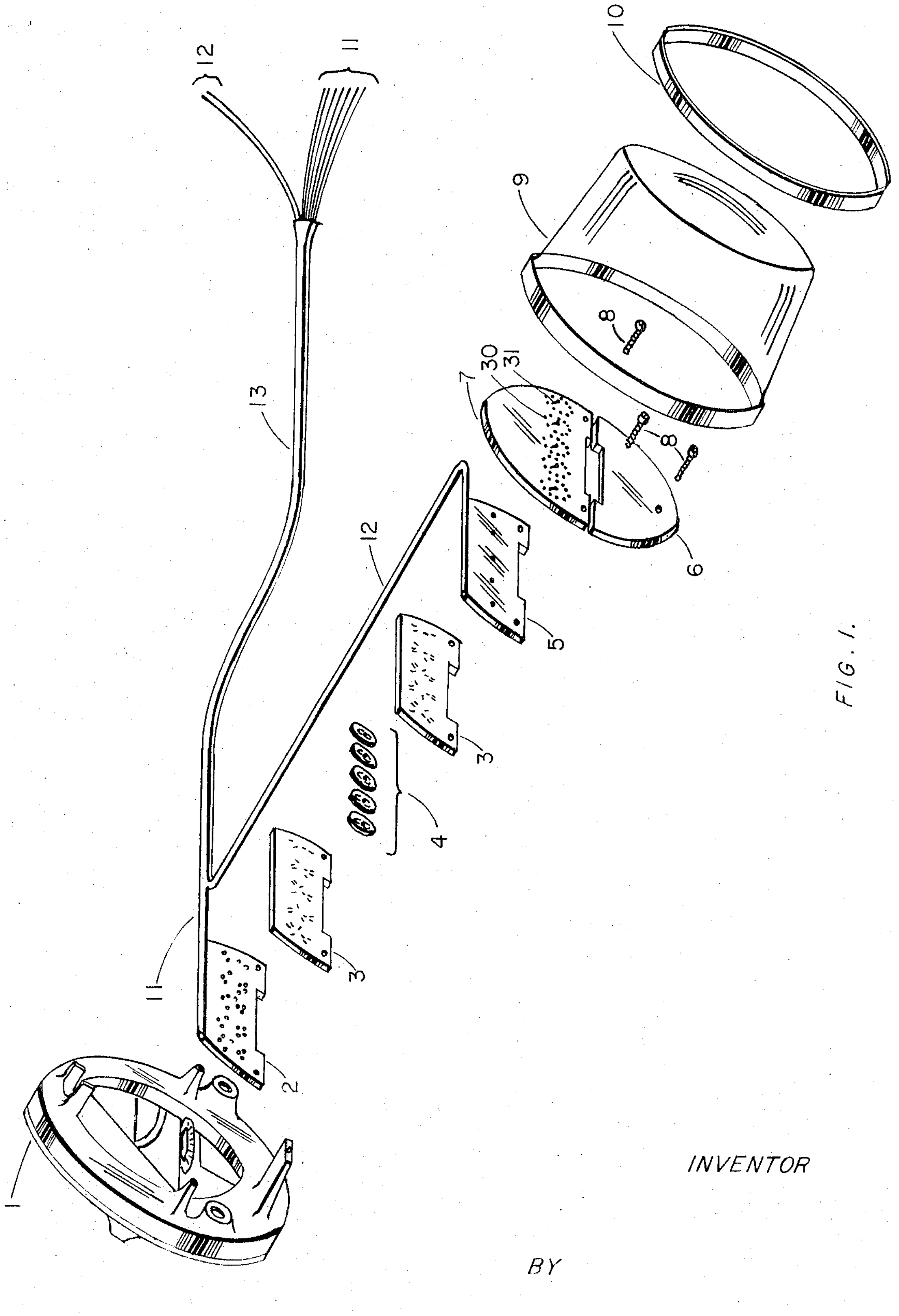
FIG. 1 is an exploded, perspective view of an electric watt-hour meter incorporating polydecade decimal-to-digital encoder means in accordance with the invention.

In FIG. 1 herein an exploded, esometric view appears of an electric watt-hour meter incorporating polydecade decimal-to-digital encoder means in accordance with the present invention. The meter shown in FIG. 1 is, with the exception of the said conversion means, of essentially conventional construction, and thus may include a base 1, nameplate 6, an indicator assembly plate 7, dust cover 9 and bezel 10. The indicator assembly plate 7 carries a plurality of dials 30 thereon, each of which, as is known, is associated with a successively higher power-of-10 digit, thereby enabling read-out of the meter by direct observation of the needle indicators 31 associated with each of the said dials. As is also known the needle indicators 31 are each mounted for rotation upon a suitable shaft (not explicitly shown), which shafts are interconnected by gearing or the like as to provide the successive 1:10 angular displacement ratio from shaft-to-shaft. Assembly screws 8 are also provided, which are receivable at corresponding openings at baseplate 1 to enable assembly of the meter.

It will, of course, be understood by those skilled in the art that the basic construction thus far set forth is representative of numerous meters which incorporate a plurality of rotating shafts in order to provide decimal read-outs of values to be measured by the said meters. That is to say, that the further elements of the invention now to be set forth are not limited to incorporation with the watt-hour meters or the like, but may be employed with corresponding effectiveness in meters used for various other purposes, as for example, similarly constructed meters utilized for measuring gas flow, water flow, or dispensing of other fluid or bulk commodities wherein cumulative recordation is effected by the meter of the quantities of such materials which may pass through a system monitored by the meter.

In accordance with the present invention, the elements of the watt-hour meter of FIG. 1 thus far described, are modified by inclusion of a plurality of encoding wheels, generally designated at 4, which wheels are coaxially mounted for rotation with dial indicators 31. One such wheel is provided for each of the various shafts which provide rotation of dial indicators 31. A continuous light source, which preferably takes the form of an electroluminescent panel 5, is mounted adjacent indicator assembly plate 7, and a pair of light masks 3, 3', sandwiches the encoding wheels 4. The combination of masks and encoding wheels, in turn is sandwiched between the electroluminiscent source 5 and a point photo-sensor assembly 2. The assembly 2, light masks 3 and 3'. and electroluminiscent source 5 are each provided with openings toward the bottoms thereof, allowing passage of screws 8 during assembly so as to secure all elements firmly to base 1.

Electroluminiscent source 5 is a conventional element essentially intended in the present application to provide a continuous and relatively uniform light source across its face where it contacts light mask 3. Source 5 is suitably electroded, as is known in the art, and the power enabling illumination is provided at the wire pair 12, which is seen to be connected to said source 5. By referring to FIG. 2 it will be seen that each light mask 3 (or 3', the masks being identical) consists of a light occluding plate 33, provided with slot clusters 19, 20, 21, 22 and 23, a given said cluster being associated with one each of the indicator dials 30. More specifically the cluster 23, seen to consist of but four slots, is associated with the dial 31 enabling reading of the unit digits on a decimal basis; the cluster 22 consisting of 7 slots, with the dial associated with the 10's-digit dial of the decimal value to be read out by the meter; the cluster 21 associated with the 100s-digit dial to be read out by the meter, etc.; up to the cluster 19, which is associated with the 10,000s digit dial.

The point light sensor assembly 2 consists of a plate 35 at which are appropriately affixed a series of point light sensors, which are arranged in clusters 14, 15, 16, 17 and 18. Each cluster is comprised of a series of individual sensors which are arranged spatially in precise correspondence to the pattern on masks 3 and 3'. The photo-sensors 37 typically comprise photo-diodes, and each of the said diodes is so connected that an output thereof indicating reception of a light signal is provided to the logic circuitry to be hereinafter discussed, after which appropriately encoded digital data indicative of the readings on the several dials 30 may pass through digital data cable 11 to an appropriate junction to cable 13 enabling transmission of the data to a utilization point.

Figure 2:
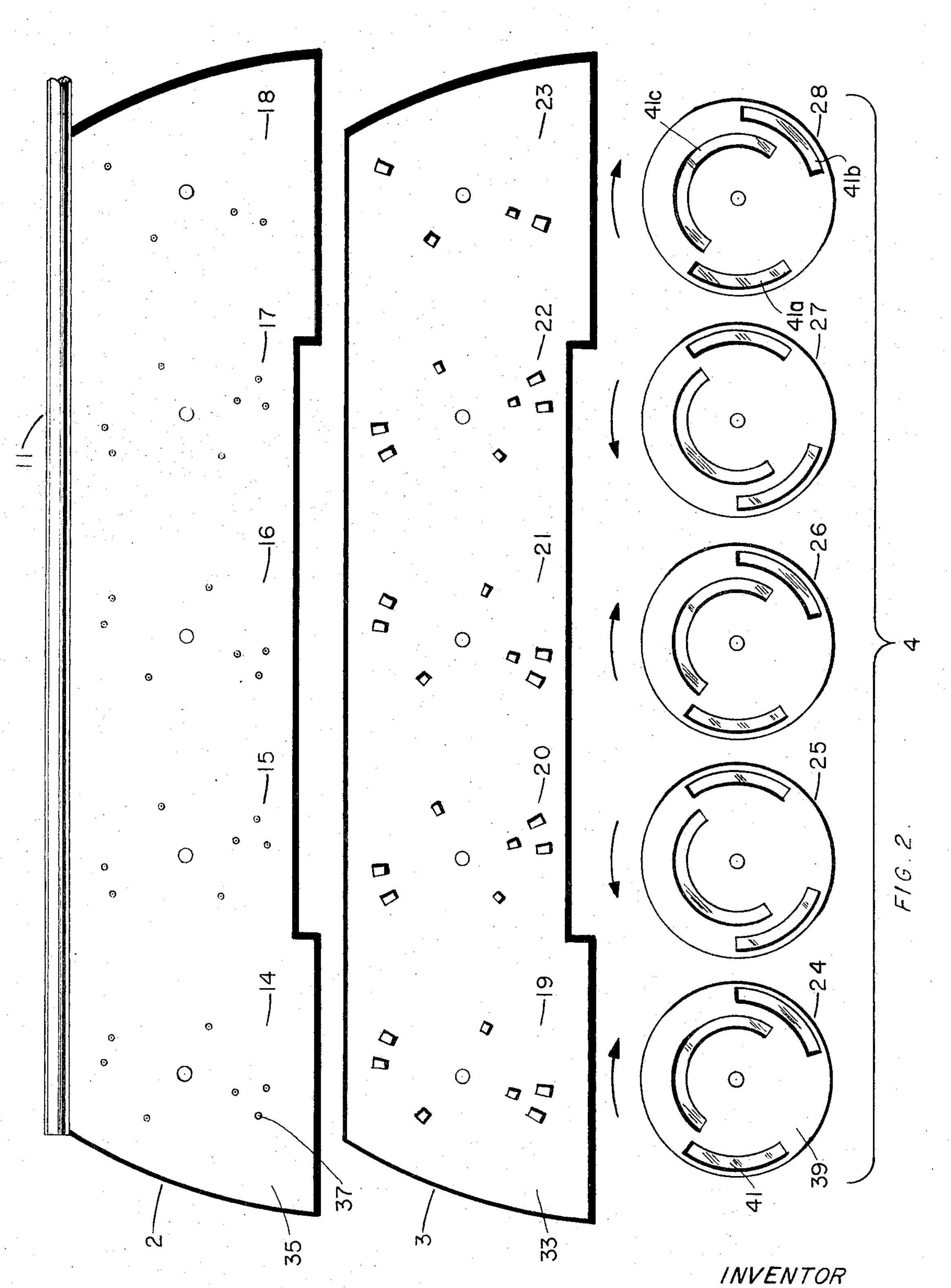
FIG. 2 is an enlarged plan view of the photo-sensor layout, the masking elements, and the several encoding wheels forming part of the FIG. 1 system.

It will be evident from the foregoing that the basic elements 2, 3, 3' and 5 thus far described, are such as to establish point sources of illumination which may impinge or not upon photodiodes 37 directly aligned with the individual point sources depending upon the position of the various encoding wheels 24 through 28 which intervene in the light path. Referring now to the latter elements, it is seen in FIG. 2 that they are characterized by an opaque wheel 39 carrying transparent slots 41 therein. The slots 41 are seen further to be arranged into two concentric circular tracks.

Referring, for example, to encoding wheel 28, which is associated with reading of the least significant digit of the meter, it is seen that the slots 41*a* and 41*b* lie on a first outer circular track and that the slot 41*c* lies on a second circular track, concentric with and inwardly of the first track. It will further be apparent, that depending upon the angular position of the various encoding wheels 24 through 28, the light path between electroluminiscence source 5 and the various photodiodes 37 associated with each of the wheels is in part occluded or exposed. In accordance with the invention it has been found that the arrangement set forth in FIG. 2, is in fact fully sufficient to not only establish the position of each encoding wheel and thus dial indicator 31 with sufficient definitude to assure that the resulting binary coded output is indicative of the decimal reading at the dial, but moreover the arrangement set forth is such as to remove possible ambiguities of the type cited at the beginning of this specification. The manner in which this is thus enabled will now be set forth.

Figure 3:
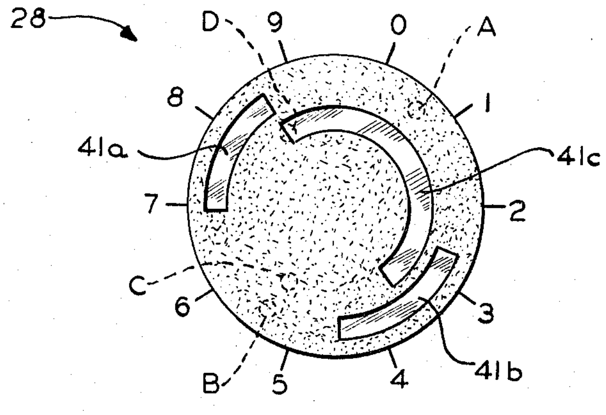
FIG. 3 is an enlarged schematic view of the code wheel utilized on the least significant digit shaft of the meter, and sets forth the location of the point photo-sensors with respect thereto.

Referring to FIG. 3, a schematic plan diagram appears showing the encoding wheel 28 used to enable reading of the rotational position of the shaft indicating the least significant digit. For purposes of analysis the diagram shows the wheel divided into 10 equal radial segments by the numbers 0 through 9 outside the disc, representing the numbers on the meter dials 30. The four photodiodes associated with cluster 18 (FIG. 2) are shown in FIG. 3 as circles and are respectively indicated as A, B, C and D. It will be apparent that as the encoding wheel 28 rotates due, for example, to energy consumption in the meter of FIG. 1, light will be rendered incident upon the various photodiodes whenever a transparent segment 41*a*, 41*b* or 41*c* is between the corresponding slot of mask 3' and a given photodiode. When this occurs the corresponding photodiode conducts and registers a binary "1". Conversely, when a black or opaque section of wheel 28 impedes the transfer of light a binary "0" results. The outputs from the several photodiodes are amplified to the logic level desired.

It will be noted that the wheel 28 utilizes but two concentric rings — which is an important advantage of the present invention, as such feature in part enables compactness. In the present application the binary "0" is represented by the absence of a signal, and it is not desirable to have the decimal symbol "0" represented by 0000, since it cannot be distinguished from an absence of signals. This is avoided in the present application by choosing 10 of the 16 possible four-bit representations that do not include the position 0000. This code utilizes the binary notation for 3 as the representation for 0. Each of the other nine symbols is represented by the binary equivalent of the symbol plus three. Since, as previously indicated, it is desirable when mechanical analogs are converted into digital form to have one and only one digit of the code change in preceding to or from the next higher or next lower number, a binary excess-3 Gray code is utilized in the present application. The code thus used has the useful properties that only one digit change is required in advancing from the 9 to 0 representation, and that change occurs in the least significant bit (LSB). At the same time, a "0" reading can be distinguished from no signal. The code thus utilized is set forth in Table 1 hereinbelow:

Table 1

| Decimal Number | Reflected binary excess-3 Gray Code equivalent |
|---|---|
| 0 | 0010 |
| 1 | 0110 |
| 2 | 0111 |
| 3 | 0101 |
| 4 | 0100 |
| 5 | 1100 |
| 6 | 1101 |
| 7 | 1111 |
| 8 | 1110 |
| 9 | 1010 |

Figure 4:
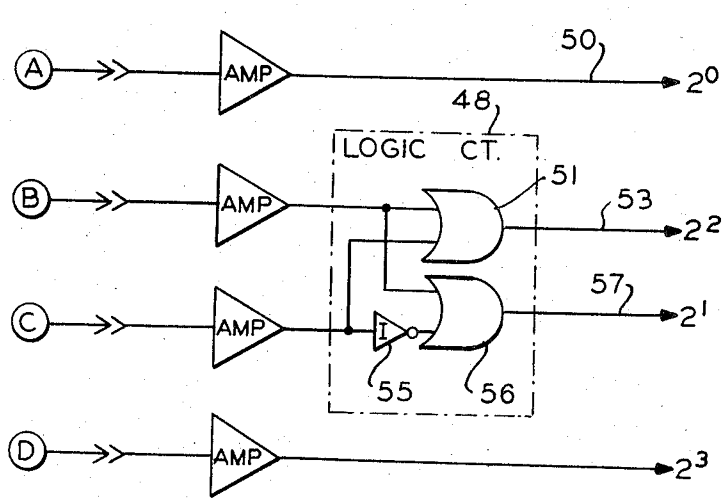
FIG. 4 is a simplified logic diagram, setting forth the manner in which appropriate outputs for use with the invention are obtained from the elements appearing in FIG. 3.

In FIG. 4 a simplified logic diagram appears, illustrating how the binary excess-3 Gray code of Table 1 may be obtained from the signals generated by the FIG. 3 arrangement. To illustrate the manner in which this is effected we may consider the output of the convertor where the wheel setting is as shown in FIG. 3. Under such conditions the photodiode A is occluded by a dark segment; therefore, it is not conducting and its output is amplified to give a "0" logic level at line 50. Photodiodes B and C are also occluded by a dark segment of wheel 28, so that their respective amplifier outputs are also at a "0" logic level. Since, therefore, both inputs of the $2^2$ OR gate 51 of logic circuit 48 are at "0" level, its output at line 53 is "0". Photodiode C's amplifier output is "0" and is inverted by inverter 55 before it is fed to one of the inputs of the $2^1$ OR gate 56. Therefore, the output at line 57 of the $2^1$ OR gate is a logical "1". Photodiodide D, on the other hand, is seen to be straddling between a dark and transparent segment of wheel 28; hence its output is either a "0" or a "1". It will be evident that under the circumstances a summary of the readings obtained from the FIG. 3 arrangement in binary form, will either be "0010" corresponding to a decimal "0", or "1010" corresponding to a decimal "9", depending upon the output from photodiode D.

The two readings indicated are evidently such as to provide an ambiguous reading, but since these particular diode positions affect only the least significant digit of the meter dial, a one digit error is tolerable. However, such an error would not be tolerable in the higher decades such as those associated with encoding wheels 27, 26, 25, or 24, where the error is compounded increasingly. In accordance with the present invention, therefore, the type of ambiguous situation indicated in FIG. 3 is logically operated upon so as to appropriately adjust the higher decade readings. For example, assume the circuitry acts to determine that the least significant digit (LSD) is reading a decimal "9". A command signal is enabled logically, directing the adjacent, higher decade output to be retarded, with successive decades being provided with a command signal in a similar manner. Thus if it happens that the rest of the digits being read are at about "9" on a decimal level, the resulting transmitted reading will be "9999"; or, on the other hand, if the LSD is reading a decimal "0", a command signal is enabled which indicates that the remaining wheel readings are to be advanced, such that the transmitted reading shall be "10,000". Typically an ADVANCE signal will be provided when the determined LSD reading is, for example, between decimal 0 and 4, and a RETARD signal when the determined LSD reading is between 5 and 9.

Referring to FIG. 2 once again, it will be clear that seven photodiodes 37 are associated with each encoding wheel except for that wheel 28 used to attain the least significant digit. The scheme of operation of the present apparatus is such that but four out of each seven photodiodes are actually utilized at one time to provide the digitally encoded output for each associated shaft. By thus utilizing excess diodes beyond the precise number necessary to encode in binary notation a number from "0" to "9", it is possible to select among pairs of lead-lag diodes so as to choose appropriate members of the pair to remove ambiguity, the members being selected in accordance with the "decision" made at the LSD wheel. This aspect of the invention is better illustrated by referring to FIG. 5, which is in general nature similar to FIG. 4, but sets forth an encoding wheel such as 27 which is associated with one of the higher power decade shafts. Photodiodes are once again schematically illustrated by circles, and the transparent or light transmitting segments of the wheel 27 by designation similar to that in FIG. 3. It is seen, however, that in addition to a single diode C, paired diodes $A_A$, $A_R$, $B_A$, $B_R$ and $D_A$ and $D_R$ are provided. Members of the pairs cited are so notated to indicate that such member is used, or its corresponding paired member used, depending upon whether an ADVANCE or RETARD signal is provided to the logical circuitry. The basic spatial arrangement of the paired "advance" and "retard" photodiodes is such that one may be choosing one or the other of the pair avoid use at the higher decades of diodes that would be near a borderline of illumination. This is to say that by selection of an "advance" or "retard" diode member of a pair in accordance with the signal enabled from the LSD shaft, one may avoid the possibility that a borderline reading is made at the higher order shafts, thereby avoiding the possibility of a resulting ambiguous reading.

Figure 5:
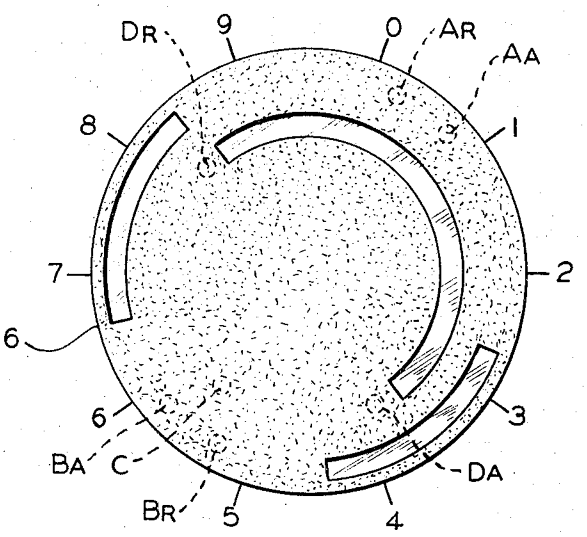
FIG. 5 is a schematic view similar to that of FIG. 3, but setting forth the code wheel and associated photo-sensor points for one of the higher decade wheels.
Figure 6:
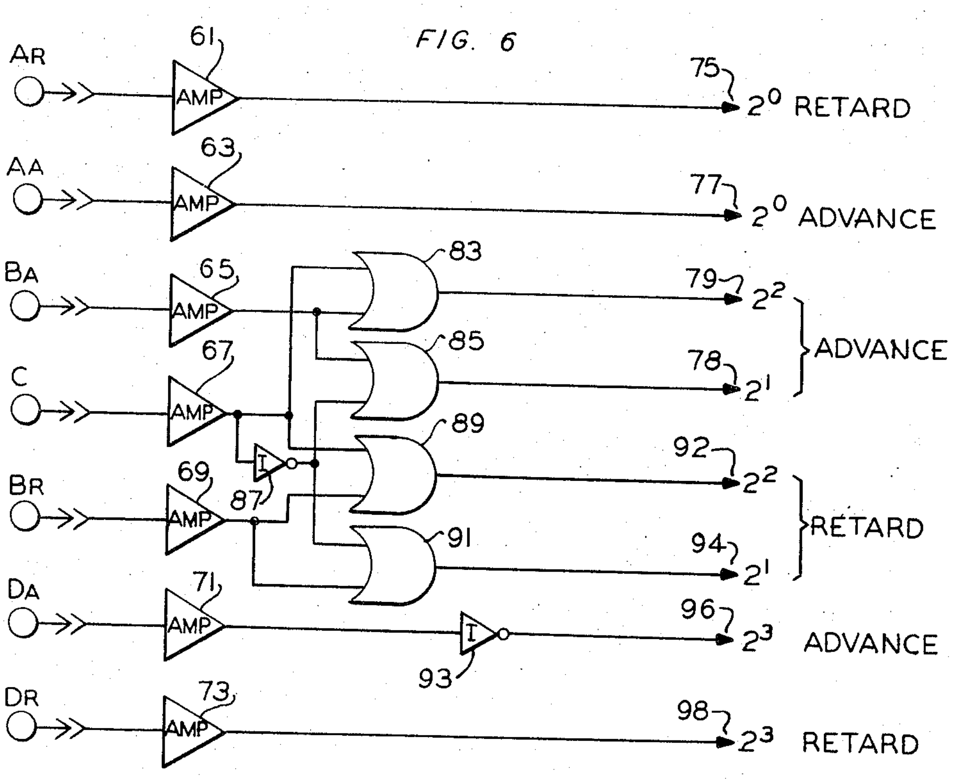
FIG. 6 is a simplified logic diagram, illustrating the manner in which the signal outputs derived from the FIG. 5 arrangement may be processed prior to use in transmission of data.

A simplified schematic diagram of the logic circuitry utilized to process the outputs from the seven diodes of FIG. 5 is set forth in FIG. 6. As seen therein the output from the various diodes identified are provided to a series of amplifiers 61 through 73. The outputs from amplifiers 61 and 63 are directly provided to outputs 75 and 77, corresponding respectively to the $2^0$ "retard" or $2^0$ "advance" binary digit output. The output from photodiode $B_A$ is provided through amplifier 65 as one input to OR gate 83. The other input for the gate 83 is the signal from photodiode C, which is first processed through amplifier 67. The output from photodiode $B_A$ is also provided to OR gate 85, the other input to the said gate comprising the output from amplifier 67 which is first inverted by inverter 87. The pair of outputs from OR gates 83 and 85 are both utilized in response to the ADVANCE command signal, as respectively the $2^2$ and $2^1$ digital coded outputs at 79 and 81.

Similarly the OR gate 89 has as one input the amplified signal from photodiode $B_R$, and as its other input the amplified output from photodiode C. OR gate 91 is also provided the amplified output from photodiode $B_R$, as well as the inverted amplified output from photodiode C. The pair of outputs from OR gates 89 and 91 are used respectively as the $2^2$ and $2^1$ digital outputs 92 and 94 upon receipt of a RETARD signal, derived from the LSD coding wheel. Finally, the outputs from photodiode $D_A$ and $D_R$, after being amplified at 71 in the case of $D_A$ and inverted at 93, are used, respectively, as the $2^3$ ADVANCE and the $2^3$ RETARD digital signals at 96 and 98.

Figure 7:
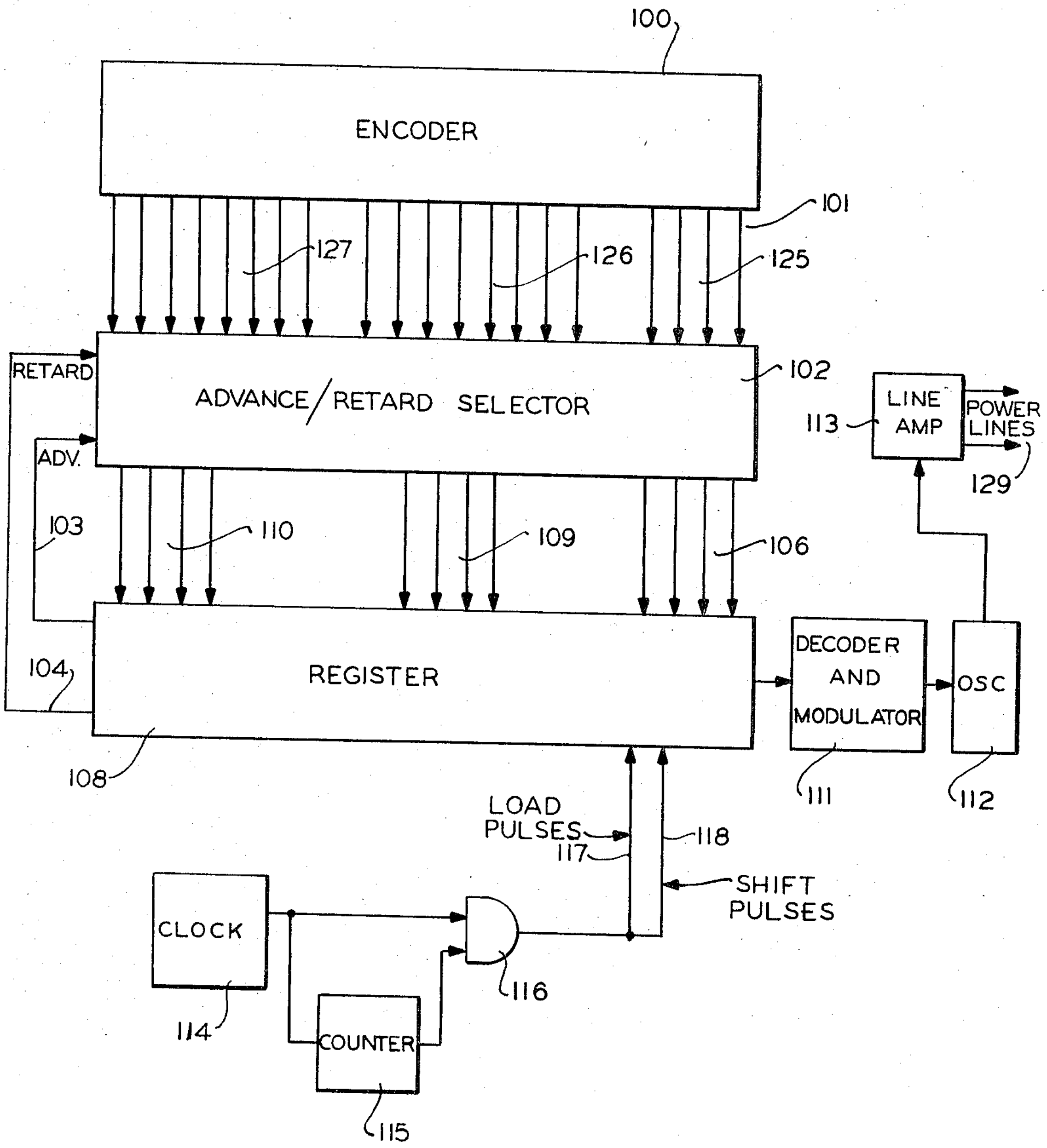
FIG. 7 is a block diagram, illustrating the meter of the invention in an overall system, whereby transmission of the digitally encoded data is enabled into a transmission line system.

An overall system utilizing the encoding means thus far set forth is illustrated schematically by the block diagram of FIG. 7 herein. The encoder block 100 shown in this Figure provides a plurality of outputs 101, including e.g. the eight outputs shown in FIG. 6 from one of the higher decade wheels. For example, in FIG. 7 four such outputs 125 are shown at the right side of block 100, and two groups 126 and 127 of eight outputs toward the left side thereof. This arrangement is, of course, indicative of the use of but three encoding wheels; in practice more are likely to be used, but for purposes of simplification only three groups of outputs 125, 126 and 127 are shown. The ADVANCE/RETARD selector means 102 which includes conventional gating circuits, then chooses among the outputs 126 in accordance with whether an ADVANCE or RETARD signal is provided to selector means 102 via the respective lines 103 and 104 from transmitter register 108. Whether such a signal ADVANCE or RETARD is given is, of course, determined by the LSD encoded signal which is furnished to register 108 by the four output lines shown at 106, and for successively higher decades by the position of the adjacent lower decade. Gating means are associated with register 108 for enabling the desired ADVANCE or RETARD signal. Thereupon, choosing among the various outputs 101, groups of 4-bit digital signals as at 109 and 110 are provided to register 108.

In a typical application the data in register 108 may be shifted on command to the FSK (frequency shift keying) modulator 111. The latter controls oscillator 112, the output of which may be amplified at 113, and then transmitted, typically directly on the power lines 129 with which the present apparatus is associated. A clock 114 and counter 115 are connected through an OR gate 116 to provide load and shift pulses respectively by the lines 117 and 118, to enable transfer of data at appropriate time intervals. All of the components described herein in connection with FIG. 7, may be either in integrated or microcircuit form, and may be formed as part of the meter assembly or mounted within the confines of the meter shown in FIG. 1.

While the present invention has been particularly set forth in terms of specific embodiments thereof, it will be understood in view of the instant disclosure, that numerous variations upon the invention are now enabled to those skilled in the art, which variations in propriety yet reside within the scope of the instant teaching. Accordingly, the invention is to be broadly construed and limited only by the scope and spirit of the claims now appended hereto.

We claim:

1. A converter for encoding the decimal digits represented by the successive stages of a multi-stage meter into binary coded form, each stage of said meter including a rotatable shaft which is angularly displaceable on a 10:1 ratio with respect to the higher adjacent shaft to record decimal readings of measurements effected by said meter, said converter comprising:

means establishing a plurality of point light sources;

a plurality of point light sensors in one-to-one optical path registration with said point light sources;

a plurality of encoding wheels, one each of said wheels being mounted for rotation upon each of the said shafts of stages of said meter said shafts being intergeared in a 10:1 ratio, the plane of said wheels intercepting the light path between said sources and sensors in registration therewith, and said wheels being provided with slots extending along circular tracks on said wheels, whereby groups of said sensors are illuminated in accordance with the angular position of said wheels to provide signal outputs from said illuminated sensors; at least four said light sensors being associated with each of said encoding wheels, said sensors being spatially distributed with respect to said slots such that a distinctive four-bit digitally encoded output may be provided for each of the ten angular positions about said wheel corresponding to decimal readings from 1 to 10, the group of said sensors associated with each of said wheels numerically exceeding the number necessary to provide said four-bit output defining said angular positions and including paired sensors in lead-lag arrangement; and decoder logic means connected to receive the outputs from two groups of sensors and provide said four-bit digital output signals each group in binary excess three code representative of the said angular positions of said wheels in accordance with the said enabled outputs from said sensors, said decoder logic including means to generate an ADVANCE/RETARD command signal in accordance with the sensor output readings derived from the said wheel associated with the least significant digit (LSD) of said meter, and said apparatus including means for selecting one or the other of said two groups of four bit signals the outputs from four among each said group of sensors, minimizing the possibility of ambiguous readings at said higher decade.

2. Apparatus in accordance with claim 1, wherein said slots are arranged in two concentric circular tracks.

3. Apparatus in accordance with claim 2, wherein at least seven said sensors are associated with each of the said wheels other than said LSD wheel, and said selection means selects the outputs from four of each said group of seven sensors.

4. Apparatus in accordance with claim 3, wherein said generating means further provides said ADVANCE/RETARD command signal enabling selection of said outputs at all decades beyond said LSD, in accordance with the determined reading at the adjacent lower decade.

5. Apparatus in accordance with claim 3, wherein said point light sources comprise an extended source electroluminiscent panel and a pair of masks provided with optically registering slots, said masks sandwiching said encoding wheels, the sandwiched combination of masks and wheels being between said electroluminiscent light source and said light sensors.

6. Apparatus in accordance with claim 5, wherein said light sensors comprise point photodiodes arrayed on an assembly plate.

7. Apparatus in accordance with claim 6, further including means to provide said encoded digital data from said logic means to a transmitting line for remote utilization of said data.

8. Apparatus in accordance with claim 7, wherein said means for providing said data to said transmission line includes register means for storing said encoded data, means to shift said data from said register upon command, means to provide a carrier for said data, and means for providing said carrier and conveyed data to said transmission line.

* * * * *